United States Patent
Kief et al.

(10) Patent No.: US 9,672,849 B2
(45) Date of Patent: Jun. 6, 2017

(54) MULTIPLE READER STACKS DISPOSED IN CLOSE PROXIMITY

(71) Applicant: Seagate Technology LLC, Cupertino, CA (US)

(72) Inventors: Mark T. Kief, Lakeville, MN (US); Thomas Roy Boonstra, Chaska, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/266,889

(22) Filed: Sep. 15, 2016

(65) Prior Publication Data

US 2017/0004851 A1    Jan. 5, 2017

Related U.S. Application Data

(62) Division of application No. 13/723,870, filed on Dec. 21, 2012, now abandoned.

(51) Int. Cl.
*G11B 5/39* (2006.01)
*G11B 5/31* (2006.01)
*G11B 5/11* (2006.01)
*G11B 5/127* (2006.01)
*H01J 37/32* (2006.01)

(52) U.S. Cl.
CPC ............ *G11B 5/3163* (2013.01); *G11B 5/112* (2013.01); *G11B 5/1272* (2013.01); *G11B 5/3912* (2013.01); *G11B 5/3948* (2013.01); *G11B 5/3958* (2013.01); *H01J 37/32009* (2013.01); *G11B 5/3909* (2013.01); *G11B 2005/3996* (2013.01); *H01J 2237/334* (2013.01); *Y10T 29/49046* (2015.01); *Y10T 29/49052* (2015.01)

(58) Field of Classification Search
None
See application file for complete search history.

(56) References Cited

U.S. PATENT DOCUMENTS

| 4,170,033 A | 10/1979 | Ridgway et al. |
| 4,656,546 A | 4/1987 | Mallory |
| 5,420,734 A | 5/1995 | Colineau et al. |
| 6,002,554 A | 12/1999 | Schmalhorst et al. |
| 6,021,024 A | 2/2000 | Akiyama et al. |

(Continued)

FOREIGN PATENT DOCUMENTS

| EP | 1207564 A2 | 5/2002 |
| JP | H11232618 A | 8/1999 |

(Continued)

OTHER PUBLICATIONS

Meloche, Eric, "Perpendicular Recording at High Areal Densities," Seagate, Feb. 14, 2008, 41 pages.

(Continued)

*Primary Examiner* — Craig A. Renner
(74) *Attorney, Agent, or Firm* — Holzer Patel Drennan

(57) ABSTRACT

In accordance with one embodiment, a multi-reader can be manufactured so as to be able to read from multiple regions of a storage device contemporaneously during operation. Such a device can be configured, for example, by forming a first wall; forming a second wall; and utilizing the first wall and the second wall to form two adjacent reader stacks.

17 Claims, 21 Drawing Sheets

(56) References Cited

U.S. PATENT DOCUMENTS

| | | |
|---|---|---|
| 6,504,675 B1 | 1/2003 | Shukh et al. |
| 6,717,780 B2 | 4/2004 | Hiramoto et al. |
| 6,771,441 B2 | 8/2004 | Tang et al. |
| 6,882,488 B1 | 4/2005 | Albrecht et al. |
| 6,954,340 B2 | 10/2005 | Shukh et al. |
| 7,072,147 B2 | 7/2006 | Limmer et al. |
| 7,126,773 B1 | 10/2006 | Taratorin |
| 7,126,890 B2 | 10/2006 | Learned et al. |
| 7,251,878 B2 | 8/2007 | Le et al. |
| 7,253,992 B2 | 8/2007 | Chen et al. |
| 7,265,941 B2 | 9/2007 | Le et al. |
| 7,342,748 B2 | 3/2008 | Yip et al. |
| 7,352,526 B2 | 4/2008 | Takaishi |
| 7,429,857 B2 | 9/2008 | Guzik et al. |
| 7,430,095 B2 | 9/2008 | Benakli et al. |
| 7,436,621 B2 | 10/2008 | Goker et al. |
| 7,436,632 B2 | 10/2008 | Li et al. |
| 7,472,469 B2 | 1/2009 | Heim et al. |
| 7,551,393 B2 | 6/2009 | Biskeborn et al. |
| 7,751,148 B1 | 7/2010 | Alstrin et al. |
| 7,889,454 B2 | 2/2011 | Johnson et al. |
| 7,916,432 B2 | 3/2011 | Ohta et al. |
| 8,035,910 B2 | 10/2011 | Mallary et al. |
| 8,130,473 B2 | 3/2012 | Hachisuka |
| 8,208,228 B2 | 6/2012 | Maat et al. |
| 2002/0067581 A1 | 6/2002 | Hiramoto et al. |
| 2002/0131213 A1 | 9/2002 | Tsuchiya |
| 2004/0021982 A1 | 2/2004 | Ozue et al. |
| 2007/0049030 A1* | 3/2007 | Sandhu et al. ...... H01L 21/0337 438/689 |
| 2007/0201160 A1 | 8/2007 | Albrecht et al. |
| 2007/0230003 A1 | 10/2007 | Barnes |
| 2008/0013199 A1 | 1/2008 | Kumar et al. |
| 2009/0002896 A1 | 1/2009 | Mallary et al. |
| 2009/0034132 A1 | 2/2009 | Miyauchi et al. |
| 2009/0168215 A1 | 7/2009 | Beach et al. |
| 2009/0284874 A1 | 11/2009 | Yin et al. |
| 2010/0020435 A1 | 1/2010 | Chen et al. |
| 2010/0110575 A1 | 5/2010 | Gao |
| 2010/0328799 A1* | 12/2010 | Braganca et al. ... G11B 5/3903 360/324.12 |
| 2011/0006033 A1 | 1/2011 | Peng et al. |
| 2011/0069413 A1* | 3/2011 | Maat et al. .......... G11B 5/3948 360/324 |
| 2012/0206830 A1 | 8/2012 | Gao et al. |
| 2013/0286502 A1 | 10/2013 | Erden et al. |
| 2013/0286511 A1 | 10/2013 | Edelman et al. |
| 2014/0055884 A1 | 2/2014 | Edelman et al. |
| 2014/0177102 A1 | 6/2014 | Kief et al. |

FOREIGN PATENT DOCUMENTS

| | | | |
|---|---|---|---|
| JP | 2006060172 A | * | 3/2006 |
| JP | 2009032382 A | | 2/2009 |
| JP | 2009507375 A | | 2/2009 |
| JP | 2011023096 A | | 2/2011 |
| KR | 10-2002-0027277 A | | 4/2002 |

OTHER PUBLICATIONS

Gibson, Garth et al., "Principles of Operation for Shingled Disk Devices", Parallel Data Laboratory, Carnegie Mellon University, Pittsburgh, PA., Apr. 2011, pp. 1-9.

Zhu, Jian-Gang (Jimmy), "New Heights for hard disk drives", Department of Electrical and Computer Engineering and Data Storage Systems Center, Carnegie Mellon University, Pittsburgh, PA., Published Jul./Aug. 2003—MaterialsToday, pp. 22-31.

Suzuki, H., "Simultaneous PES Generation, Timing Recovery, and Multi-Track Read on Patterned Media: Concept and Performance", IEEE Transactions on Magnets, vol. 46, Issue 3, published Mar. 2010, Abstract only.

* cited by examiner

MULTIPLE READER STACKS DISPOSED IN CLOSE PROXIMITY

CROSS-REFERENCE TO RELATED APPLICATION

The present application is a divisional application of U.S. patent application Ser. No. 13/723,870 filed Dec. 21, 2012, and titled "Multiple Reader Stacks In Close Proximity", which is hereby incorporated by reference in its entirety.

BACKGROUND

Magnetic storage devices often store data on what are commonly referred to as "tracks." These tracks can store long sequences of binary data that can be read by a reader. The tracks are often formed in close proximity to one another. For example, hard disk drives often utilize disks that store data with the tracks formed as concentric rings.

SUMMARY

This Summary is provided to introduce a selection of concepts in simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

In accordance with one embodiment, a multi-reader can be manufactured so as to be able to read from multiple regions of a storage device contemporaneously during operation. Such a device can be configured, for example, by forming a first wall; forming a second wall; and utilizing the first wall and the second wall to form two adjacent reader stacks.

In another embodiment, a multi-reader can be configured, for example, by forming a first reader stack and a second reader stack within not more than about 100 nanometers of one another.

These and various other features and advantages will be apparent from the following detailed description.

BRIEF DESCRIPTION OF THE DRAWINGS

A further understanding of the nature and advantages of the present technology may be realized by reference to the figures, which are described in the remaining portion of the specification.

DETAILED DESCRIPTION

The density of tracks used on memory devices continues to improve. As one example, the density of tracks used on hard disk drives continues to improve so that tracks are being placed closer and closer together. In accordance with one embodiment, multiple tracks may now be read contemporaneously. For example, one reader of a multi-track reader may be used to read one track while a second reader of the multi-track reader may be used to read a second track. In accordance with one embodiment, a technique may be used so as to form a multi-reader in which the read stacks are placed in close proximity to one another, such as with a spacing of not more than about 100 nanometers between the adjacent edges of the reader stacks.

Figure 1:
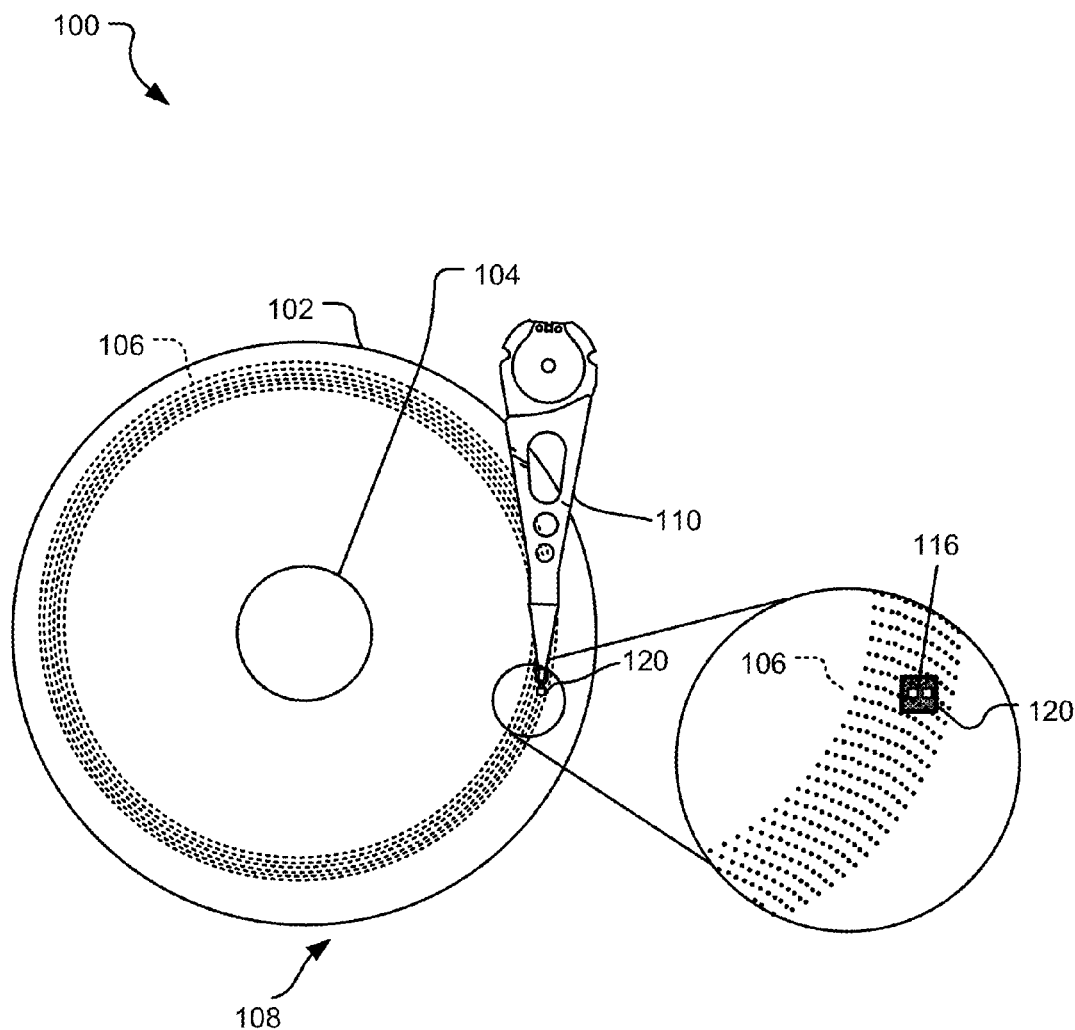
FIG. 1 illustrates an example of a hard disk drive device that can be used with a multi-reader head.

Referring now to FIG. 1, an example of a multi-reader device 100 can be seen. FIG. 1 shows a hard disk drive. The hard disk drive can be read by a reader head. In the example shown in FIG. 1, the reader head is shown having two readers for reading from two regions contemporaneously. FIG. 1 shows this as reading from a first track of the hard disk and reading from a second track of the hard disk at the same time. This is accomplished by fabricating the read head so as to have a first reader stack and a second reader stack. The hard disk drive may, for example, be more efficient because it can read at least two tracks at the same time.

FIG. 1 illustrates a plan view of an example transducer head 120 with multiple read sensors 116. A disc 108 rotates about a disc axis of rotation during operation. Further, the disc 108 includes an outer diameter 102 and inner diameter 104 between which are a number of concentric data tracks 106, illustrated by circular dashed lines. The data tracks 106 are substantially circular and are made up of regularly spaced patterned bits, for example, indicated as dots or ovals on the disc 108 as well as in exploded view. It should be understood, however, that the described technology may be employed with other types of storage media, including continuous magnetic media and discrete track (DT) media.

Information may be written to and read from the patterned bits on the disc 108 in different data tracks 106. The transducer head 120 is mounted on an actuator assembly at an end distal to an actuator axis of rotation and flies in close proximity above the surface of the disc 108 during disc operation. The actuator assembly 110 rotates during a seek operation about the actuator axis of rotation positioned adjacent to the disc 108. The seek operation positions the transducer head 120 over target data tracks. The exploded view shows the transducer head with two read sensors 116 (with the actuator assembly 110 omitted.

For purposes of illustration, a data track direction represents a direction along a circumference or a tangent of a data track and a cross track direction represents a direction that crosses the width of a track (e.g., along a radius). "Up-track" refers to the direction of head travel relative to the track.

It should also be understood that the multi-reader could be oriented so as to read from a single track. For example, the multi-reader could read from two different regions of the same track contemporaneously. Thus, for example, one embodiment might allow servo data on a track to be read from a first reader while the stored data on the track is read with the second reader. This might be more difficult because of the geometry of the tracks. It might work more readily for wider tracks.

Figure 2A:
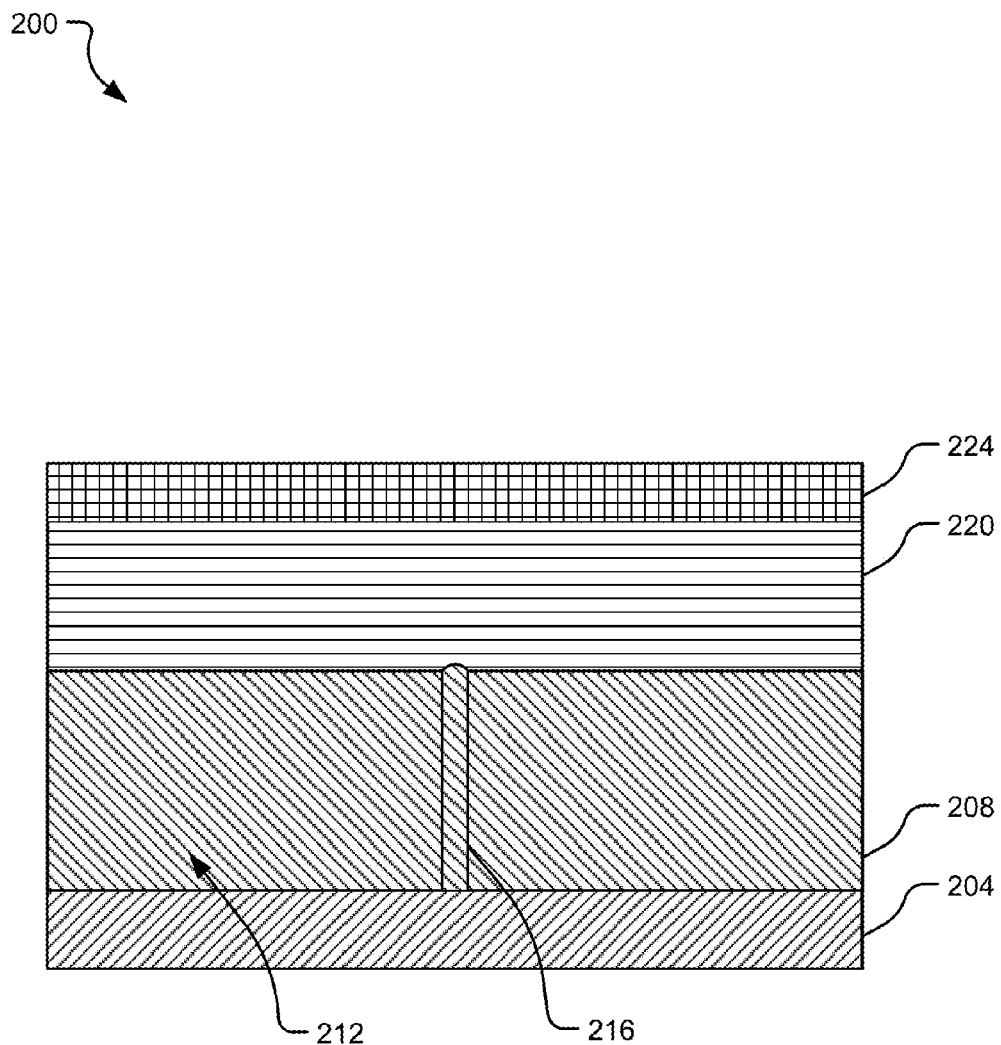
FIGS. 2A, 2B, 2C, 2D, 2E, 2F, 2G, and 2H show a process of manufacturing a multi-reader in accordance with one embodiment.

Referring now to FIGS. 2A, 2B, 2C, 2D, 2E, 2F, 2G, and 2H, a process for configuring a multi-reader device 200 can be seen. In FIG. 2A, the device 200 has been formed from basecoat layer 204, a shield layer, a stack layer 220, and a hardmask layer 224. The shield layer in this example is shown as a divided shield with portions 208 and 212 electrically isolated from one another by insulator 216. The insulator may be formed, for example, from Al2O3. The basecoat may be formed, for example, from Al2O3, SiO2 or other insulators. Material for the shield may be formed, for example, from NiFe, NiFeX, CoNiFe(X), Co(X), CoFe(X), FeSiAl (where X=Transition metal) or other suitable magnetically soft alloys. The stack material may be formed, for example, from a tunnel junction stack material or giant magnetoresistance (GMR) stack material. The hardmask may be formed, for example, from amorphous Carbon, SiC, Ta(N) or other etch resistance material. The plane of the air bearing surface of the read head would effectively be parallel to the plane in which FIG. 2A is drawn.

It should be noted that typical readers today are current-perpendicular-to-the-plane (CPP) in which current flows through the thickness of the stack material. The shield material provides magnetic shielding for improved resolution. Both electrical and magnetic functions are maintained for two or more readers. It should also be understood that the shields may serve as electrical leads for electrically coupling the reader in a circuit.

Figure 2B:
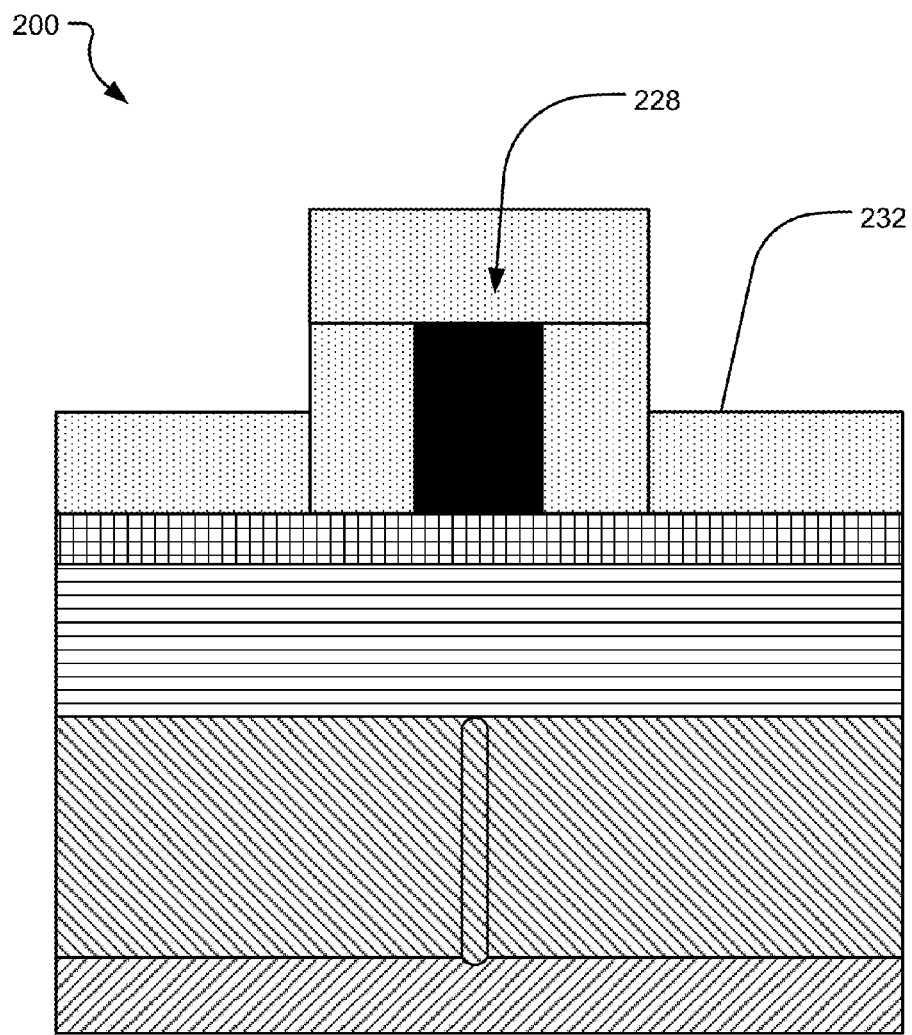

FIG. 2B shows that a mandrel 228 can be deposited. The mandrel may be formed, for example, as a carbon block. The mandrel may be positioned symmetrically between the pre-determined positions of the readers. As will be seen below, the readers are subsequently formed relative to the location of the mandrel. So, the positioning of the mandrel not only allows the readers to be formed close to one another but it also can be used to dictate the position of the readers.

Figure 2C:
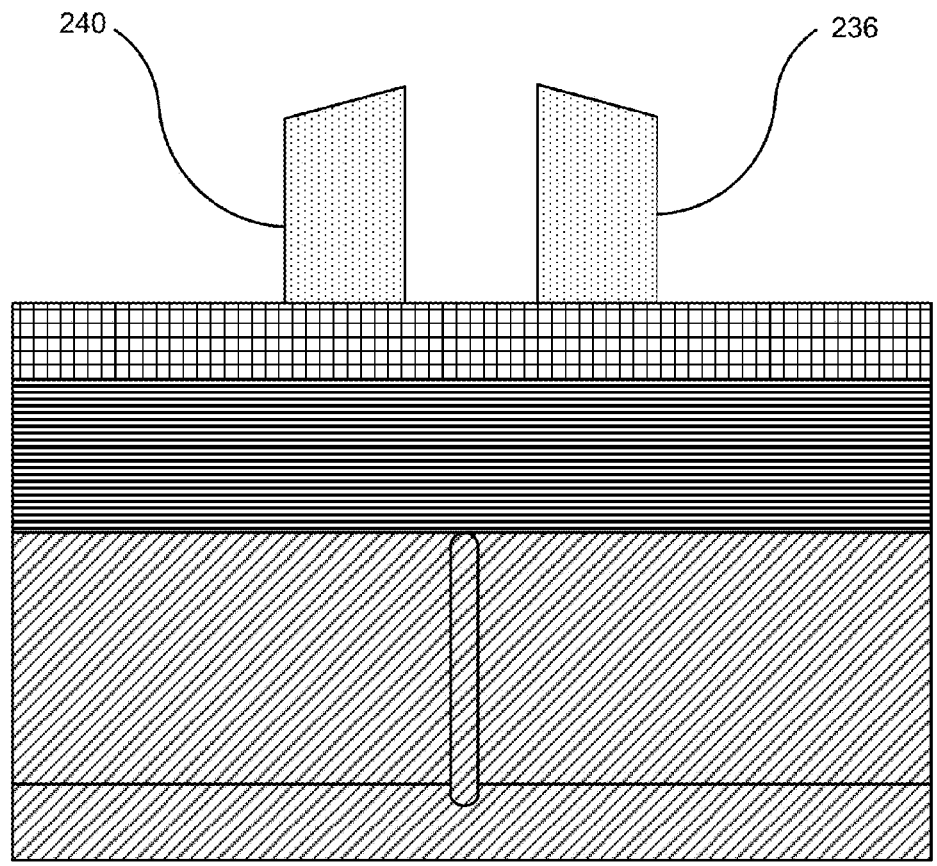

The mandrel may then be covered by a conformal coat 232. The conformal coat may be formed, for example, from SiO2, Al2O3 or other oxide or nitride. One aspect of the conformal coat is that it may be applied to the sides of the mandrel so as to produce side deposition. "Highly conformal coating" may be used in which the coating can produce sidewall deposition that is equivalent to that of the field deposition. However, it also should be appreciated that "partial conformal coating" in which the sidewall deposition is thinner than the field deposition may be used. The term conformal coating is intended to be inclusive of highly conformal coating and partial conformal coating. A significant portion of the conformal coat may then be removed, for example by an anisotropic etch, so as to clear the conformal material along the horizontal plane in FIG. 2B. This exposes the mandrel and retains most, if not all, of the conformal material along the sidewalls of the mandrel. The mandrel itself may then be removed. For example, the mandrel may be etched out with a selective etch. The result is that the sidewalls of the conformal material are retained as a first wall 236 and a second wall 240, as shown in FIG. 2C.

Figure 2D:
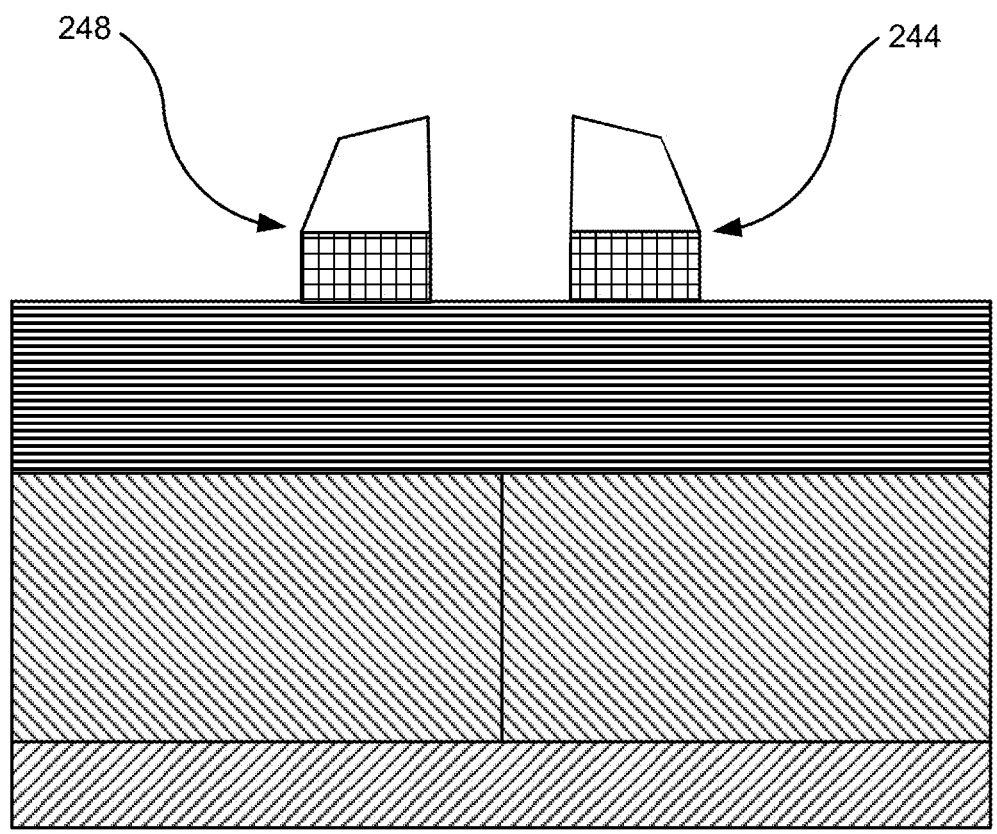

Once the walls 236 and 240 are formed, they may be used in forming the reader stacks. FIG. 2D shows that the hardmask layer may be removed except for the hardmask material beneath the walls. For example, the hardmask material may be removed by an inductively coupled plasma (ICP) etch or other reactive ion etch (RIE) process. This produces a substantially straight transfer from the spacer pattern. This process results in the hardmask below the walls 240 and 236 being left in place while the remainder of the hardmask layer 224 is removed, resulting in walls 244 and 248. In a different embodiment where only a hardmask cap exists, the wall hardmask could be used directly to pattern the stack.

Figure 2E:
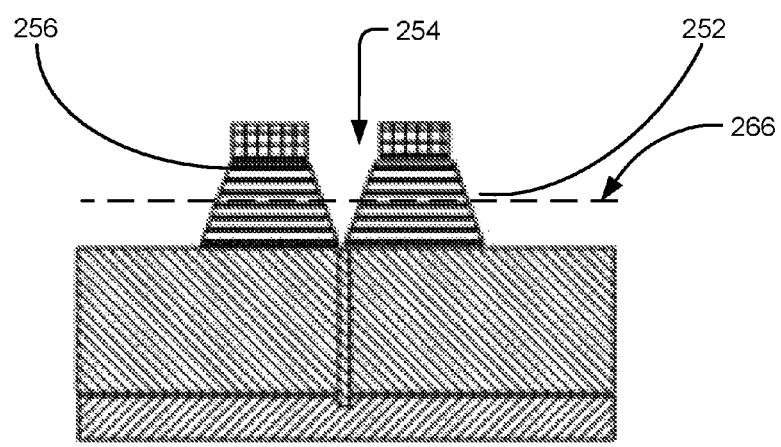
Figure 2F:
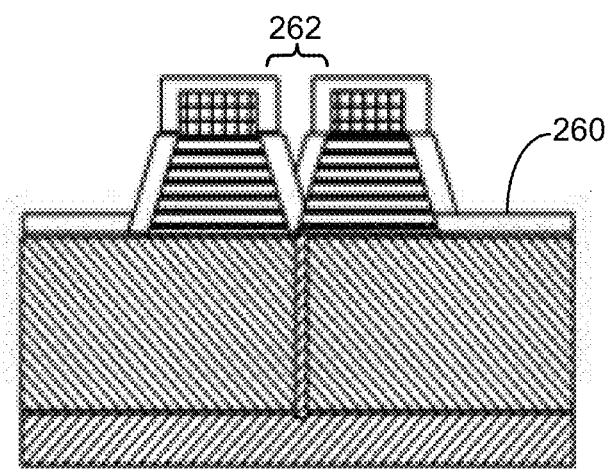

The structure shown in FIG. 2D may then be etched to form reader stacks 256 and 252 in FIG. 2E along axis 266. For example, a reactive ion etch (ME) may be used to transfer the pattern down into the stack layer so as to define a first and second reader. One may also use other etch techniques such as milling or reactive ion beam etching (RIBE). The etching forms a clear valley 254 between reader stacks 256 and 252. As can be seen, the reader stacks are formed symmetrically relative to the original position of the mandrel. The structure in FIG. 2E may then be covered with a conformal layer 260 (e.g., as shown in FIG. 2F). The conformal layer may be formed, for example, from an atomic layer volatilization (ALV) or a chemical vapor deposition (CVD) process as shown in FIG. 2F. In this manner, the two reader stacks are formed symmetrically about the insulation between them so as to form a symmetrical junction 262.

Figure 2G:
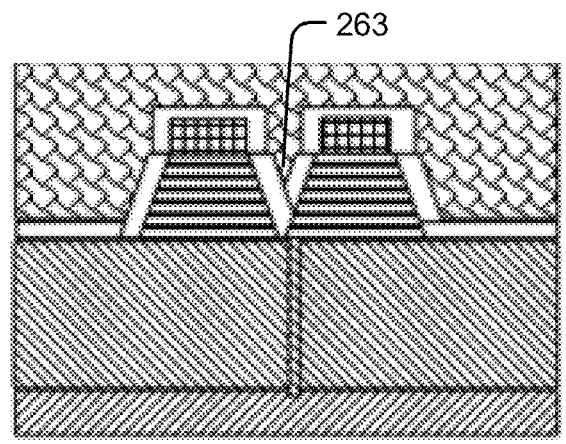

FIG. 2G shows that an isolation layer 263 may be deposited over the structure shown in FIG. 2F. The isolation layer can electrically isolate the first reader stack 252 from the second reader stack 256, for example.

Figure 2H:
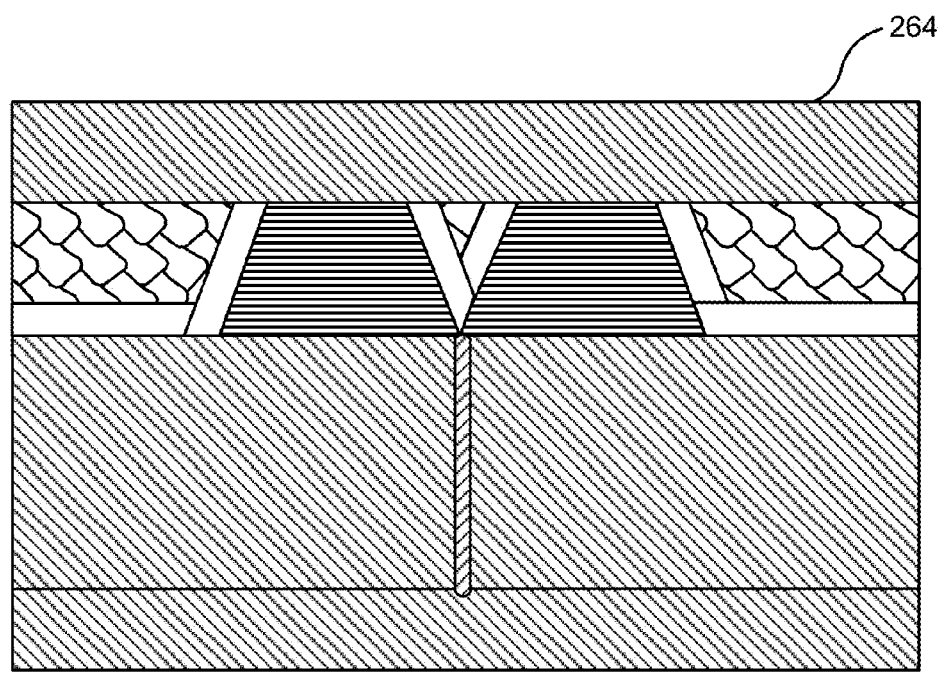

Finally, FIG. 2H shows that the structure shown in FIG. 2G may be planarized to remove the remaining hardmask. And a top shield layer 264 may be added. The result is two reader stacks that are configured in close proximity to one another. For example, the reader stacks may be formed to be within about 100 nanometers of one another. When the readers are used to read from a hard disk drive, they may be used to read from tracks that have a track pitch of approximately 50 nanometers, in accordance with this example. For example, each reader may have a width of 25 nanometers and be separated from the other reader by 25 nanometers. This allows each reader to be centered over a first and second track wherein each track is 50 nanometers wide.

Figure 3A:
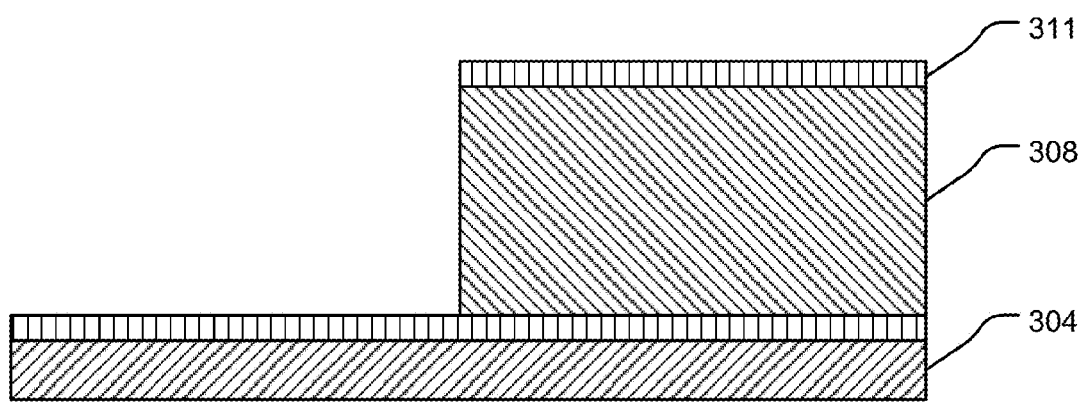
FIGS. 3A, 3B, 3C, 3D, 3E, and 3F illustrates an example of a process of manufacturing a split-shield for use with a multi-reader, in accordance with one embodiment.

It is not necessary that a split bottom shield be used in all embodiments. However, when a split bottom shield is desired, the process shown in FIGS. 3A, 3B, 3C, 3D, 3E, and 3F may be used. FIG. 3A shows that a basecoat layer 304 may be deposited. A first shield portion 308 may be deposited above the basecoat layer. Once the first shield portion is configured, it can be covered by a hardmask layer 311.

Figure 3B:
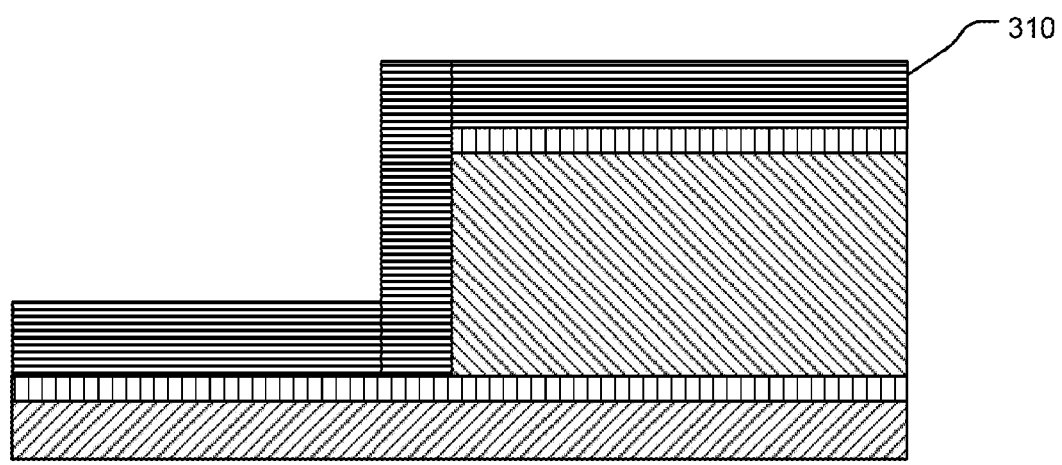

FIG. 3B shows that an isolation material 310 may be deposited. The sidewall deposition of the isolation material 310 can be used to form an electrical isolation between the first shield portion and a subsequent shield portion.

Figure 3C:
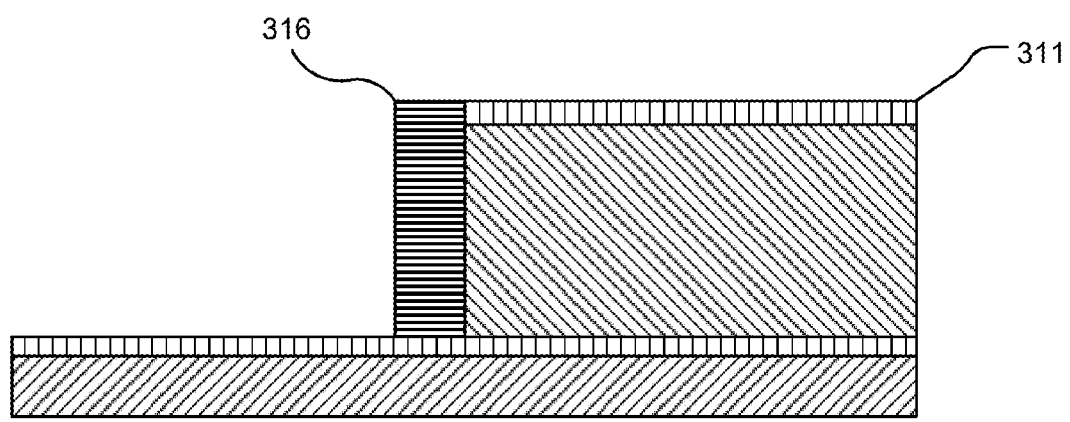

In FIG. 3C, the isolation material is shown as having been etched away so as to leave just the sidewall isolation 316 and hardmask layer 311. The isolation material may be formed, for example, from Al2O3, SiO2, or a magnetic insulator such as ferrite. The magnetic insulator can provide good electrical isolation and reduce the effect upon shield magnetization structure.

Figure 3D:
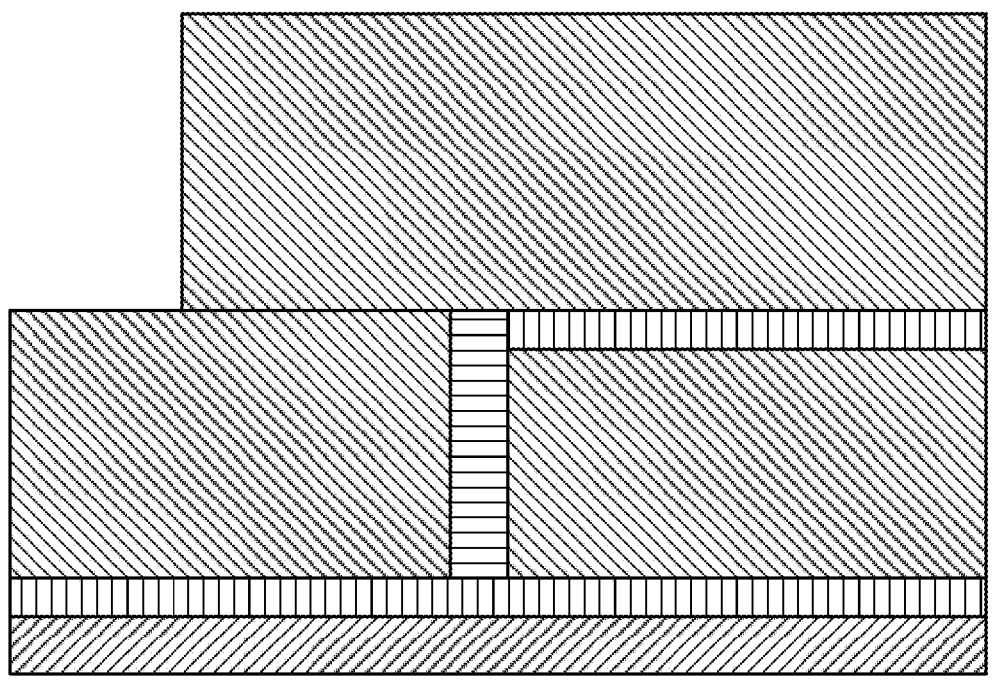
Figure 3E:
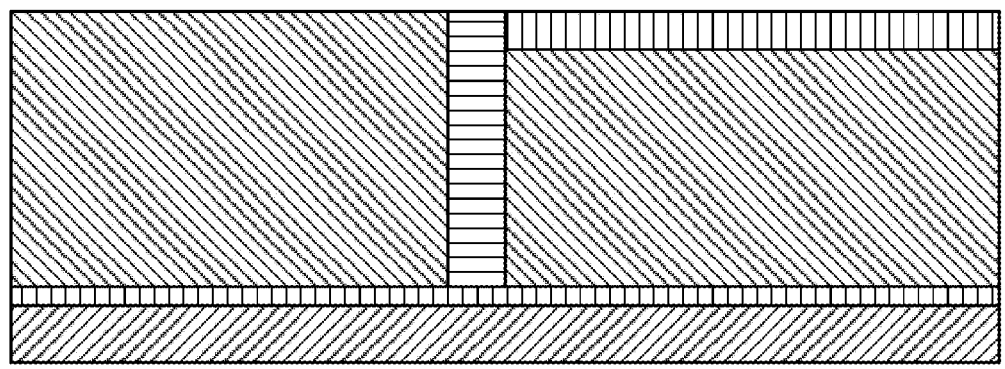
Figure 3F:
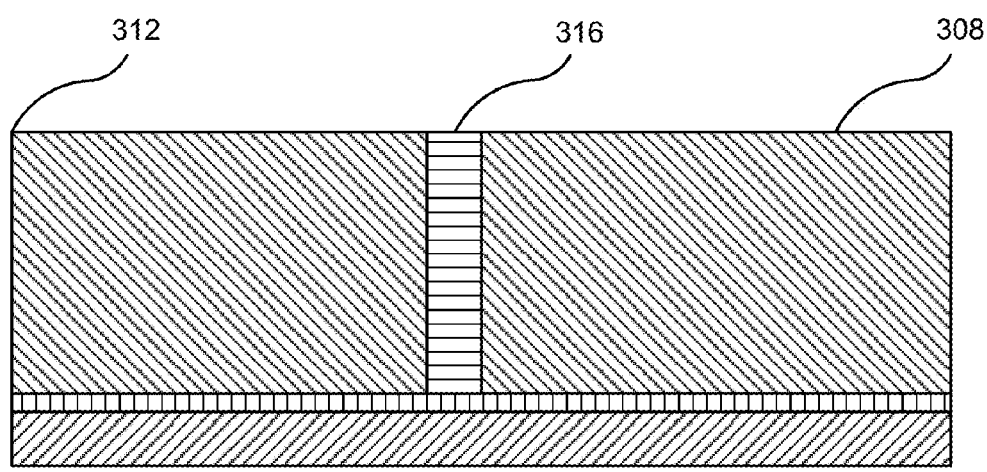

In FIG. 3D, additional shield material is shown as having been deposited. This structure may then be planarized to produce the second shield portion. The planarization may be performed, for example, by chemical-mechanical planarization (CMP) or etch. The resulting structure is shown by FIG. 3E. Finally, FIG. 3F shows that the remaining hardmask layer may be removed and the structure may be planarized to produce a subtantially planar surface. The resulting structure shown in FIG. 3F has a divided shield comprised of a first shield portion 308 and a second shield portion 312 separated by insulator 316.

Once the split bottom shield in FIG. 3F is produced, it may be further configured with a stack layer and a hardmask layer to arrive at the structure shown in FIG. 2A. The insulator between the two shield portions provides electrical isolation between the two shield portions.

FIGS. 3A, 3B, 3C, 3D, 3E, and 3F illustrate an embodiment for forming a split botttom shield structure. It should be appreciated that a similar process could be followed to form a split top shield, as well. Moreover, it should be appreciated that various combinations of bottom shields and top shields may be used. Referring now to FIGS. 4A, 4B, 4C, 4D, 4E, 4F, 4G, and 4H different shielding arrangements can be seen.

Figure 4A:
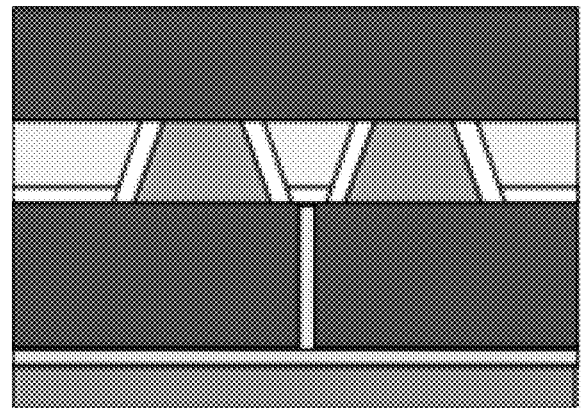
FIGS. 4A, 4B, 4C, 4D, 4E, 4F, 4G, and 4H illustrate examples of different split readers in accordance with different embodiments.
Figure 4B:
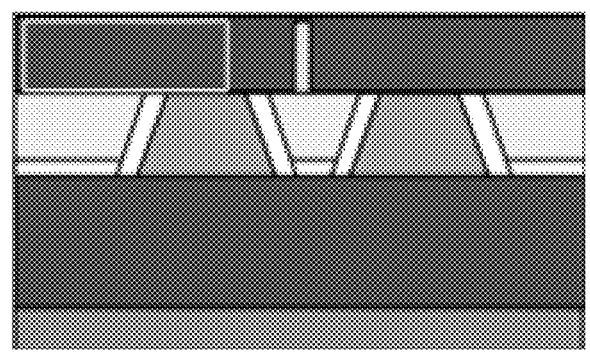
Figure 4C:
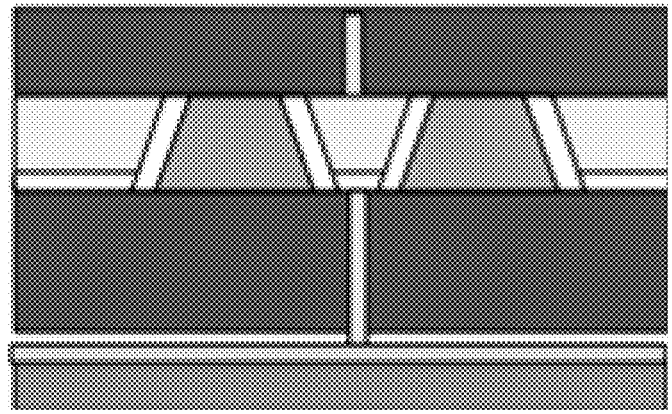

FIG. 4A shows an example of a split bottom shield and an un-split top shield. FIG. 4B shows an example of a split top shield and an un-split bottom shield. FIG. 4C shows a split top shield and a split bottom shield.

Figure 4D:
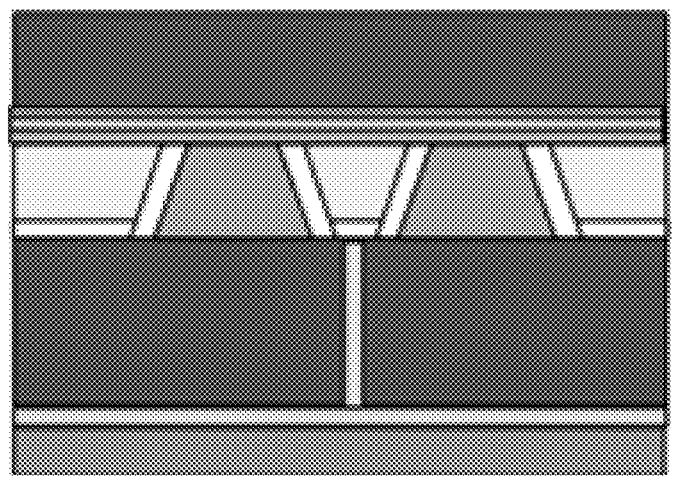
Figure 4E:
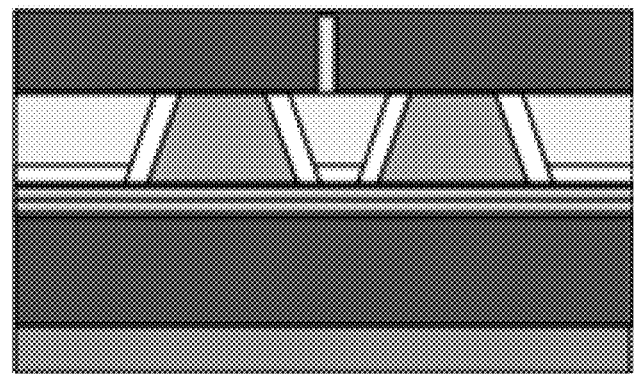

FIG. 4D shows a split bottom shield and an un-split top shield. However, this embodiment differs from that shown in FIG. 4A in that an optional synthetic antiferromagnet (SAF) shield layer, such as CoFe/Ru/CoFe or NiFe/CoFe/Ru/CoFe/NiFe, is disposed between the un-split top shield and the tops of the reader stacks. FIG. 4E shows a split top shield and an un-split bottom shield. An optional SAF shield layer is disposed between the un-split bottom shield and the reader stacks.

Figure 4F:
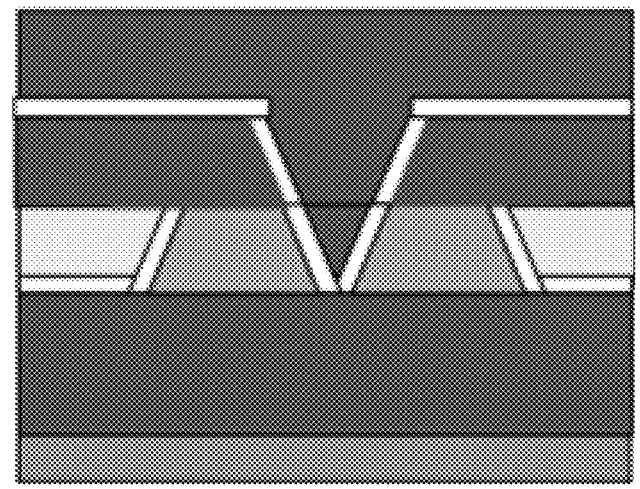

FIG. 4F shows an alternative process approach where the two readers are formed with the split top shield by etching a trench in center of larger feature.

Figure 4G:
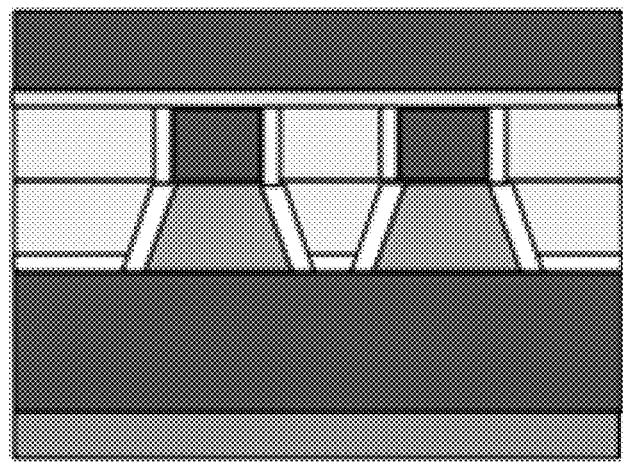

FIG. 4G shows another alternative with separate leads formed on top of the stacks which provide both downtrack shielding and individual electrical connections. Furthermore, these structures are electrically isolated from the top shield and avoid the need for electrically sub-dividing the shield.

Figure 4H:
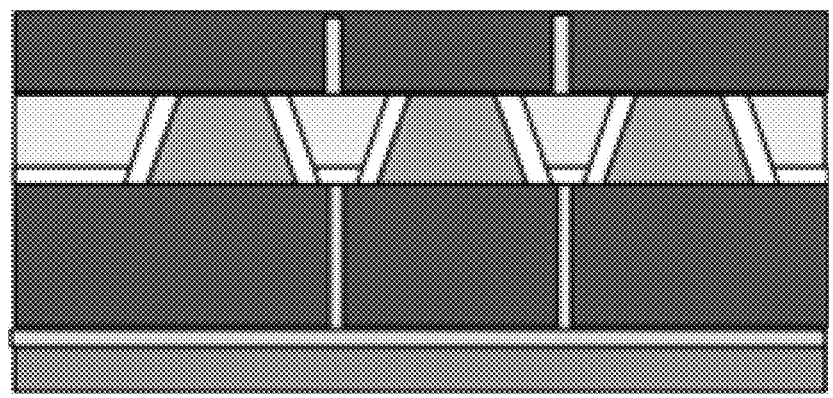

FIG. 4H illustrates that more than two readers can be fabricated. For example, the embodiment shown in FIG. 4H shows that three readers can be configured. FIG. 4H shows the three readers having split top shields and split bottom shields. One might choose to utilize more than three readers, as well.

Figure 5:
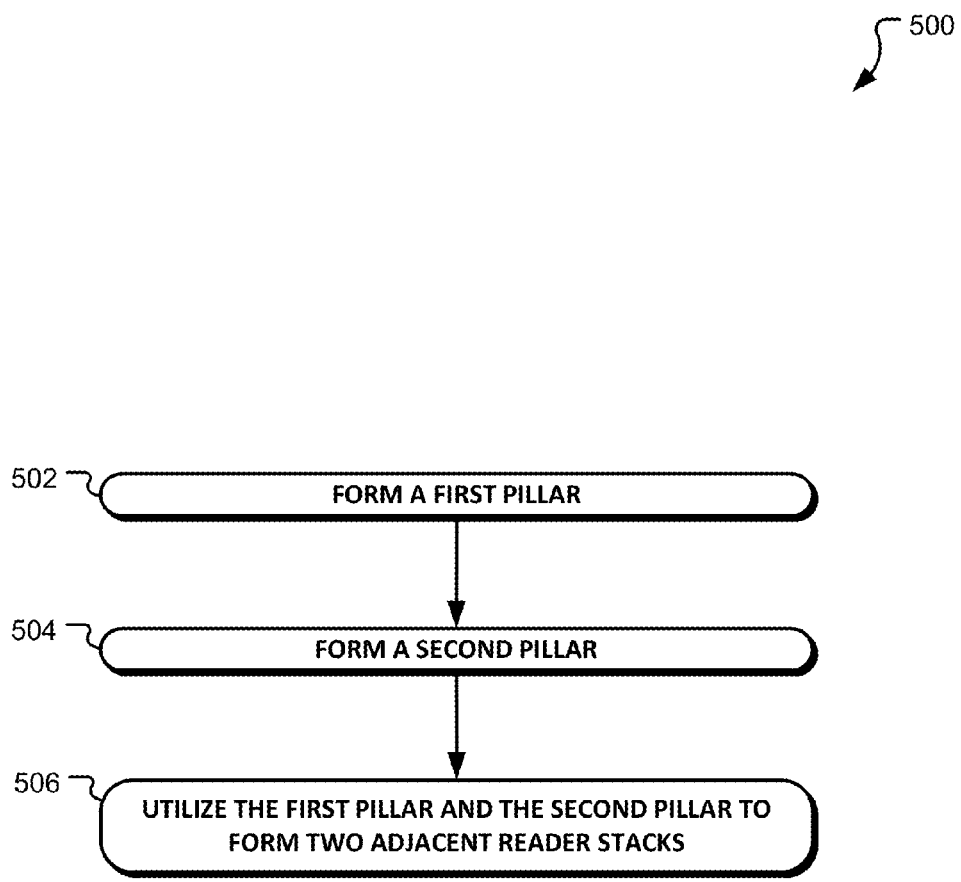
FIG. 5 shows a flow chart illustrating a method in accordance with one embodiment.

Referring now to FIG. 5, a flow chart 500 is shown that illustrates one embodiment. A first operation block from the flow chart is shown as operation 502. In this operation, a first pillar is formed. In operation 504, a second pillar is formed. The first and second pillars may be formed at the same time by semiconductor processing techniques. The separate recitation of the formation of the pillars is not intended to imply that they must be formed at different times. Once the first and second pillars are formed, operation 506 shows that the first and second pillars may be utilized to form two adjacent reader stacks.

Figure 6:
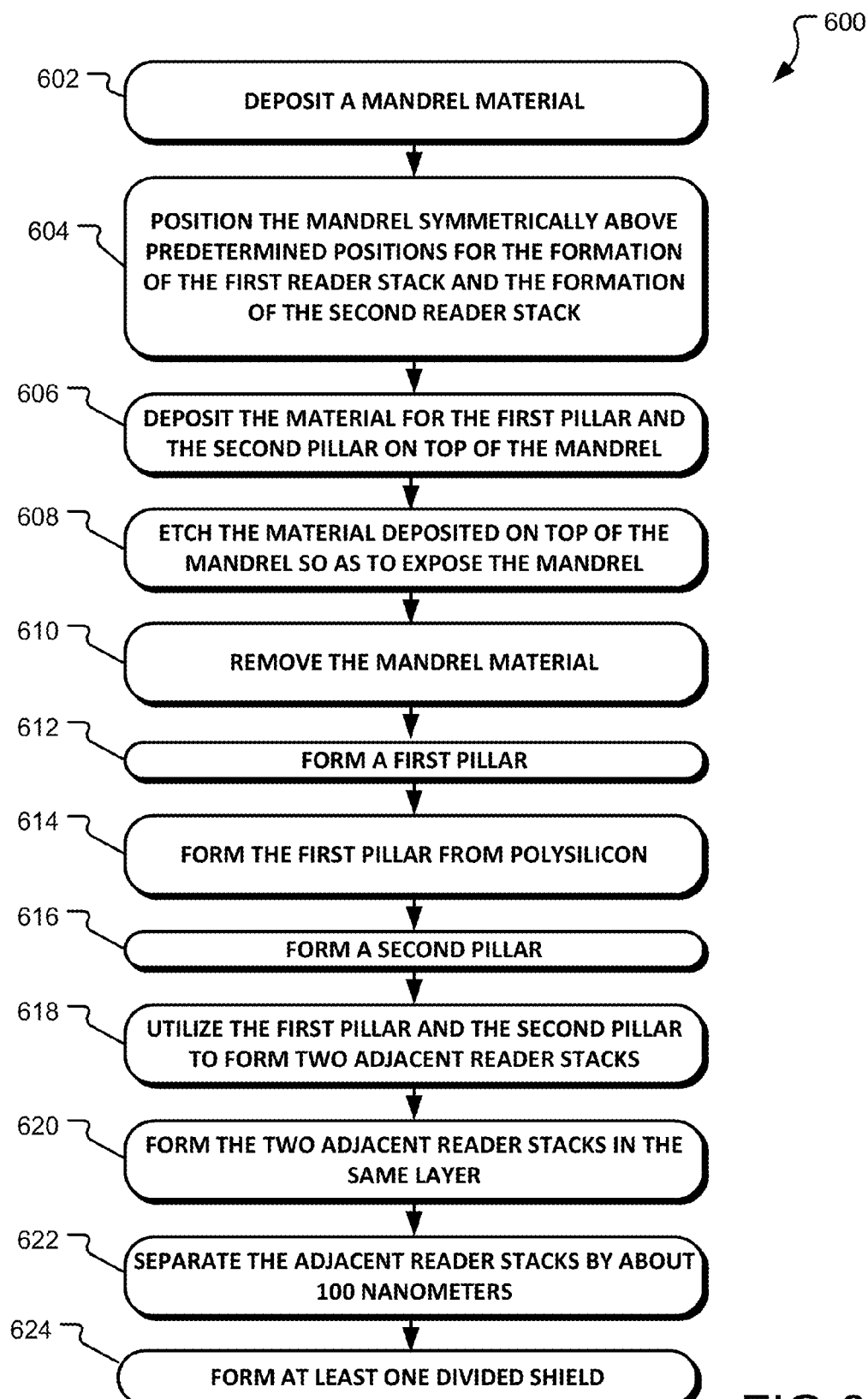
FIG. 6 shows another flow chart illustrating a method in accordance with another embodiment.

Referring now to FIG. 6, another example of constructing a multi-reader can be illustrated by flow chart 600. In operation block 602, a mandrel material may be deposited. The position of the mandrel material may be selected to be in symmetrical relation to the selected positions of the reader stacks that will be configured. For example, the mandrel may be centered along a center line that is the symmetrical dividing line between the designated positions for first and second reader stacks that will be configured. This is shown by operation 604.

In operation 606, the material for the first and second walls is deposited on the mandrel. This deposition includes deposition of the material along the sidewalls of the mandrel. After deposition, material along the top surface of the mandrel may be removed. In one embodiment, any material deposited over the top of the mandrel is removed by etching, as shown by operation 608. Once the top surface of the mandrel is re-exposed, the mandrel material may be removed. This is shown as operation 610.

The removal of the mandrel material results in the side deposits that were made along the mandrel being left in place to form first and second walls, as shown by operations 612 and 616. The walls will be made from the material that was deposited in operation 606. Thus, for example, operation 614 illustrates that polysilicon can be used to form the first and second walls.

Once the first and second walls are established above the layer of reader stack material, the reader stack material may be etched to divide the reader stack material into separate portions. This can be accomplished by removing the reader stack material between the walls so as to form a valley. The material is removed all the way down to the layer of material beneath the reader stack. This allows electrical separation to be formed between the two reader stacks that are formed. In this manner, the two readers are formed symmetrically about the insulation between them, so as to form a symmetrical junction. Thus, operation 618 shows that the walls are used to form two adjacent reader stacks.

Because the reader stacks are formed from the same initial layer of reader stack material, the reader stacks are effectively formed in the same layer, as shown by operation 620. The reader stacks may be placed in close proximity to one another with narrow dimensions that allow the reading from multiple tracks. For example, this technique described above allows the closest edges of the reader stacks to be configured within about 100 nanometers of one another as shown by operation 622. In accordance with another embodiment, the closest edges of the reader stacks may be placed within about 25 nanometers of one another. In accordance with still another embodiment, the closest edges of the reader stacks may be placed within about 5 nanometers of one another.

Finally, operation 624 illustrates that at least one divided shield may be used on either the bottom or top of the read stacks.

The techniques described above permit the reader stacks to be configured in close proximity to one another. This allows reader stacks to be configured that can read from two tracks that are also in close proximity to one another. The width of the mandrel allows the walls to be configured in close proximity to one another. This is accomplished by using side deposition of the material along the mandrel, prior to the mandrel's removal. The walls then allow for the etching of the reader stack material so as to form separate reader stacks in close proximity to one another. The use of the walls allows for readers to be configured that normally could not be configured due to constraints of present day lithography tools. Moreover, the process described herein can allow for the use of less expensive lithography tools or processing. Potentially, this can give improved uniformity of the reader stacks as well as improved sigma control. The formation of two reader stacks at the same time can reduce process steps relative to the number of steps that would be required to form multiple readers if only standard processing techniques were used. In addition, forming readers from the same layer allows one to reduce variation in the qualities of the resulting readers because both readers are based on material deposited as part of the same reader stack formation process.

The walls also help to overcome shadowing problems that might be incurred if an ion milling process were to be used to try to form the reader stacks. The reader stacks may be formed with symmetric shapes in the process described above without shadowing effects. Shadowing can be reduced as well by using reactive ion etch (RIE), a combination of reactive ion etch (RIE) and ion beam etch (IBE), or reactive ion beam etch (RIBE).

The multi-reader structure described herein can be useful, for example, as track density of a storage medium increases. Increasing track density allows hard disk drive areal density growth. Multi-readers allow improved TPI capability and increased data rate from multiple simultaneous readers in accordance with one embodiment. It does not appear that current TPH process technology can pattern small close readers with good control and yield.

Although the diagrams and flowcharts disclosed herein describe various embodiments in the context of storage devices for purposes of illustration and explanation, it is to be understood that the technology disclosed herein can be more broadly used for storage media beyond simply disk drives.

The embodiments described herein may be implemented as logical steps. Accordingly, the logical operations making up the embodiments described herein are referred to variously as operations, steps, objects, or modules. Furthermore, it should be understood that logical operations may be performed in any order, unless explicitly claimed otherwise or a specific order is inherently necessitated by the claim language.

The above specification, examples, and data provide a complete description of the structure and use of exemplary embodiments. Since many embodiments can be made without departing from the spirit and scope of the claimed invention, a claimed invention is defined by its respective claim language and supporting specification.

The invention claimed is:

1. A method of forming two adjacent reader stacks comprising:
   depositing a mandrel material on a hardmask layer, the mandrel material having a first sidewall and a second sidewall;
   covering the mandrel material with a conformal coat, the conformal coat forming a first wall on the first sidewall of the mandrel material and a second wall on the second sidewall of the mandrel material;
   removing the mandrel material to retain the first and second walls;
   removing hardmask material of the hardmask layer, a portion of the hardmask material of the hardmask layer retained under the first and second walls to form a wall structure including the hardmask material and the first wall and the second wall of the conformal coat; and
   etching the wall structure to form a first and a second reader stack of the two adjacent reader stacks.

2. The method of claim 1 wherein the first reader stack and the second reader stack are formed in the same layer.

3. The method of claim 1 wherein the first reader stack and the second reader stack are separated by no more than 100 nanometers.

4. The method of claim 1 further comprising:
   forming the first reader stack and the second reader stack symmetrically spaced on respective sides of an insulating divider.

5. The method of claim 1 wherein the wall structure is etched to form a clear valley between the first reader stack and the second reader stack.

6. The method of claim 1 further comprising:
   forming at least one divided shield, wherein a first portion of the divided shield is in electrical contact with the first reader stack and a second portion of the divided shield is in electrical contact with the second reader stack and wherein the first portion of the divided shield and second portion of the divided shield are separated by an electrical insulator.

7. The method of claim 1 wherein the mandrel material is formed as a carbon block.

8. The method of claim 1 further comprising:
   removing a portion of the conformal coat by anisotropic etch to remove the conformal material of the conformal coat along a horizontal plane parallel to the hardmask layer.

9. The method of claim 1 wherein the hardmask material is removed by an inductively coupled plasma (ICP) etch.

10. The method of claim 1 wherein etching the wall structure to form the first and the second reader stack of the two adjacent first reader stack further comprises:
    using a reactive ion etch to transfer a pattern down into a stack layer to define the first reader stack and the second reader stack.

11. The method of claim 1 further comprising:
    covering the first reader stack and the second reader stack with a second conformal layer.

12. The method of claim 11 further comprising:
    depositing an isolation layer over the first reader stack and the second reader stack and the conformal layer to electrically isolate the first reader stack from the second reader stack.

13. The method of claim 12 further comprising:
    planarizing the isolation layer and the first reader stack and the second reader stack to remove the portion of the hardmask material of the hardmask layer retained; and
    adding a shield layer on top of the planarized isolation layer, the first reader stack, and the second reader stack.

14. The method of claim 13 wherein the shield layer is a divided shield.

15. The method of claim 1 wherein the hardmask layer is deposited above a bottom shield.

16. The method of claim 15 wherein the bottom shield is a divided bottom shield, a first portion of the divided bottom shield is in electrical contact with the first reader stack and a second portion of the divided bottom shield is in electrical contact with the second reader stack and wherein the first portion of the divided bottom shield and second portion of the divided shield are separated by an electrical insulator.

17. The method of claim 1 wherein the first reader stack and the second reader stack are formed symmetrically relative to the original position of the mandrel material.

* * * * *